United States Patent
Ho

(10) Patent No.: US 11,776,904 B2
(45) Date of Patent: Oct. 3, 2023

(54) SEMICONDUCTOR DEVICE WITH CARBON HARD MASK AND METHOD FOR FABRICATING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 115 days.

(21) Appl. No.: 17/550,354

(22) Filed: Dec. 14, 2021

(65) Prior Publication Data

US 2022/0157713 A1 May 19, 2022

Related U.S. Application Data

(62) Division of application No. 17/099,215, filed on Nov. 16, 2020, now Pat. No. 11,545,431.

(51) Int. Cl.
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76877* (2013.01)

(58) Field of Classification Search
CPC ......... H01L 21/32139; H01L 21/31144; H01L 21/31116; H01L 21/76838; H01L 21/76831; H01L 23/5226
See application file for complete search history.

(56) References Cited

U.S. PATENT DOCUMENTS

| | | |
|---|---|---|
| 6,939,808 B2 | 9/2005 | Tzou et al. |
| 7,564,136 B2 | 7/2009 | Yeh et al. |
| 9,324,634 B2 | 4/2016 | Bao et al. |
| 9,929,096 B2 | 3/2018 | Zhou |
| 2004/0180551 A1 | 9/2004 | Biles et al. |
| 2005/0009350 A1 | 1/2005 | Vogt |

(Continued)

FOREIGN PATENT DOCUMENTS

TW 201732883 A 9/2017

OTHER PUBLICATIONS

Office Action dated Apr. 28, 2022 related to U.S. Appl. No. 17/099,215, wherein this application is a DIV of U.S. Appl. No. 17/099,215.

(Continued)

*Primary Examiner* — Jaehwan Oh
*Assistant Examiner* — John M Parker
(74) *Attorney, Agent, or Firm* — Xuan Zhang

(57) ABSTRACT

The present application discloses a semiconductor device with a carbon hard mask. The semiconductor device includes a substrate, conductive layers positioned on the substrate, a carbon hard mask layer positioned on the conductive layers, an insulating layer including a lower portion and an upper portion, and a conductive via positioned along the upper portion of the insulating layer and the carbon hard mask layer and positioned on one of the adjacent pair of the conductive layers. The lower portion is positioned along the carbon hard mask layer and positioned between an adjacent pair of the conductive layers, and the upper portion is positioned on the lower portion and on the carbon hard mask layer.

8 Claims, 12 Drawing Sheets

(56) References Cited

U.S. PATENT DOCUMENTS

| | | | |
|---|---|---|---|
| 2009/0072401 A1 | 3/2009 | Arnold et al. | |
| 2014/0027664 A1* | 1/2014 | Lei | H10N 70/231 |
| | | | 252/520.5 |
| 2016/0293837 A1 | 10/2016 | Xiao | |
| 2020/0006126 A1* | 1/2020 | Liou | H01L 23/53295 |
| 2020/0126912 A1 | 4/2020 | Chandhok et al. | |
| 2021/0017641 A1 | 1/2021 | Ling et al. | |

OTHER PUBLICATIONS

Office Action dated Jun. 28, 2022 related to Taiwanese Application No. 110127229.
Summary translation of Office Action dated Jun. 28, 2022 related to Taiwanese Application No. 110127229.

* cited by examiner excellent etch selectivity of the carbon hard mask layer may be beneficial to form fine etch profile during formation of the conductive layers. Furthermore, the carbon hard mask layer can be kept for providing electrically insulation function for

SEMICONDUCTOR DEVICE WITH CARBON HARD MASK AND METHOD FOR FABRICATING THE SAME

CROSS-REFERENCE TO RELATED APPLICATION

This application is a divisional application of U.S. Non-Provisional application Ser. No. 17/099,215 filed on Nov. 16, 2020, which is incorporated herein by reference in its entirety.

TECHNICAL FIELD

The present disclosure relates to a semiconductor device and a method for fabricating the semiconductor device, and more particularly, to a semiconductor device with a carbon hard mask and a method for fabricating the semiconductor device with the carbon hard mask.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, conductive layers positioned on the substrate, a carbon hard mask layer positioned on the conductive layers, an insulating layer including a lower portion and an upper portion, and a conductive via positioned along the upper portion of the insulating layer and the carbon hardmask layer and positioned on one of the adjacent pair of the conductive layers. The lower portion is positioned along the carbon hard mask layer and positioned between an adjacent pair of the conductive layers, and the upper portion is positioned on the lower portion and on the carbon hard mask layer.

In some embodiments, a thickness of the carbon hard mask layer is between about 80 nm and about 500 nm.

In some embodiments, the insulating layer is formed of a low-k dielectric material.

In some embodiments, the carbon hard mask layer is formed of a carbon film.

In some embodiments, the semiconductor device includes an adhesion layer positioned between the carbon hard mask layer and the conductive layers.

Another aspect of the present disclosure provides a method for fabricating a semiconductor device including providing a substrate, forming a layer of conductive material on the substrate, forming a carbon hard mask layer on the layer of conductive material, forming a conductive layer trench along the carbon hard mask layer and the layer of conductive material and turning the layer of conductive material into conductive layers, forming an insulating layer to completely fill the conductive layer trench and on the carbon hard mask layer, and forming a conductive via electrically coupled to the conductive layers.

In some embodiments, the insulating layer is formed of a low-k dielectric material.

In some embodiments, the carbon hard mask layer is formed of a carbon film.

In some embodiments, a process temperature of the step of forming the carbon hard mask layer is between about 100° C. and about 700° C.

In some embodiments, a process pressure of the step of forming the carbon hardmask layer is between about 1 Torr and about 20 Torr.

In some embodiments, the step of forming the conductive layer trench includes: forming a first hard mask layer on the carbon hard mask layer, patterning the first hard mask layer to form a first trench, performing a carbon hard mask etch process to form a second trench along the carbon hard mask layer and extended from the first trench, and performing a conductive layer etch process to extend the second trench to the layer of conductive material to form the conductive layer trench.

In some embodiments, the first hard mask layer is formed of boron nitride, silicon boron nitride, phosphorus boron nitride, boron carbon silicon nitride, silicon, silicon germanium, tetraethyl orthosilicate, silicon nitride, silicon oxynitride, silicon nitride oxide, silicon carbide, or a combination thereof.

In some embodiments, a process pressure of the step of forming the first hard mask layer is between about 2 Torr and about 10 Torr.

In some embodiments, etchant gases of the carbon hard mask etch process include an oxygen gas and a silicon-containing gas.

In some embodiments, the silicon-containing gas includes silicon tetrafluoride, silicon tetrachloride, silane, or a combination thereof.

In some embodiments, a flow rate of the oxygen gas is between about 20 sccm and about 60 sccm.

In some embodiments, a flow rate of the silicon-containing gas is between about 10 sccm and about 30 sccm.

In some embodiments, a process duration of the carbon hard mask etch process is between 70 second and about 110 second.

In some embodiments, the etchant gases consist essentially of about 50% to 95% by volume of the oxygen gas and about 50% to 5% by volume of the silicon-containing gas based on the total volume of the etchant gases.

In some embodiments, a process temperature of the conductive layer etch process is between about 200° C. and about 550° C.

Due to the design of the semiconductor device of the present disclosure, the carbon hard mask layer may act as a carbon source for passivating the conductive layers using thin polymer films, thereby preventing corrosion of the conductive layers. As a result, the yield/reliability of the semiconductor device may be improved. In addition, the excellent etch selectivity of the carbon hard mask layer may be beneficial to form fine etch profile during formation of the conductive layers. Furthermore, the carbon hard mask layer can be kept for providing electrically insulation function for the conductive layers. Therefore, the complexity of fabricating of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
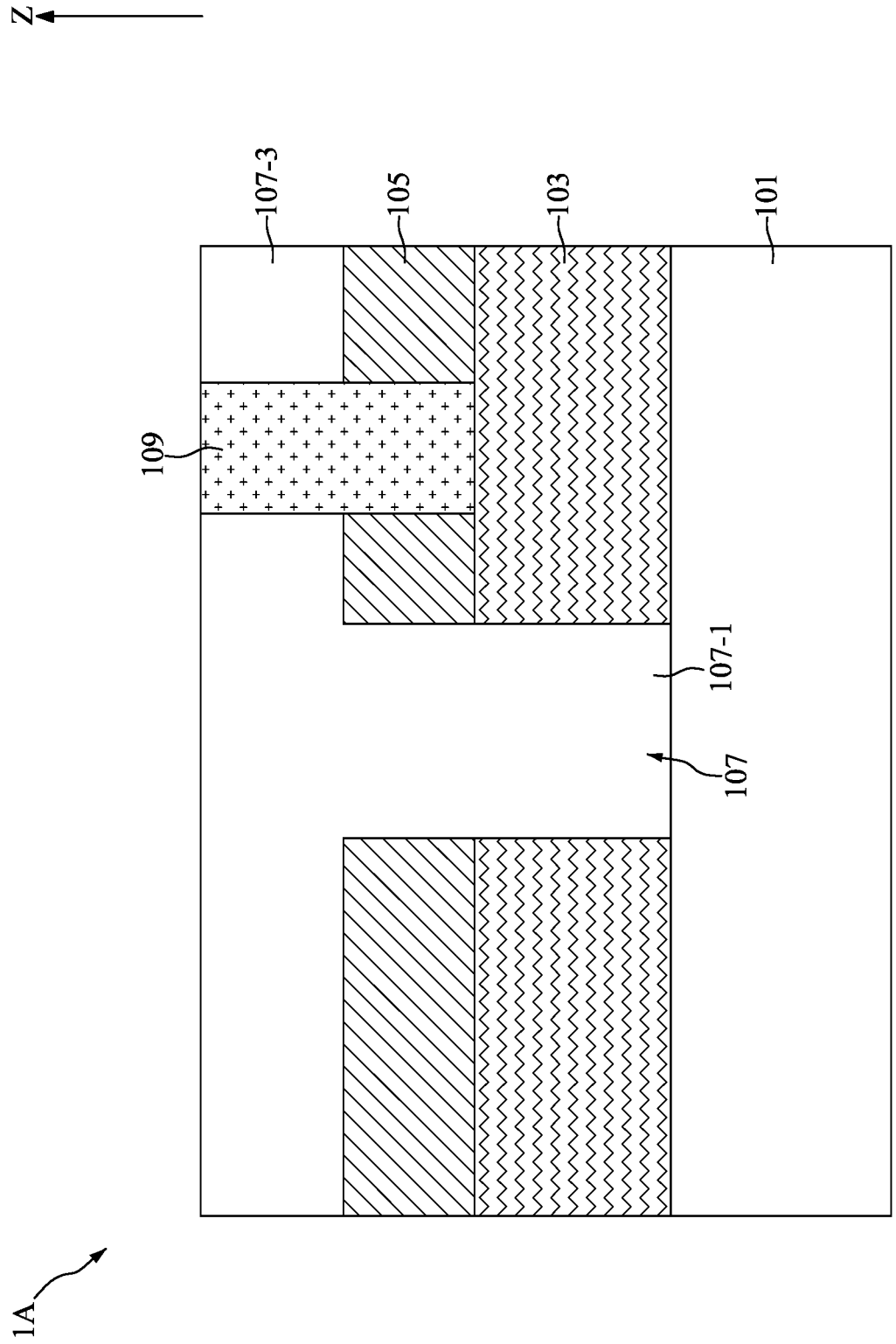
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 101, conductive layers 103, a carbon hard mask layer 105, an insulating layer 107, and a conductive via 109.

With reference to FIG. 1, the substrate 101 may include a bulk semiconductor substrate that is composed at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; a non-semiconductor material, such as soda-lime glass, fused silica, fused quartz, calcium fluoride; other suitable materials; or combinations thereof.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm.

In some embodiments, the substrate 101 may include dielectrics, insulating layers, or conductive features disposed on the bulk semiconductor substrate or the topmost semiconductor material layer. The dielectrics or the insulating layers may be formed of, for example, silicon oxide, borophosphosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 1, the conductive layers 103 may be disposed on the substrate 101. In some embodiments, the conductive layers 103 may be formed of, for example, tungsten, aluminum, titanium, copper, titanium nitride, or a combination thereof. In some embodiments, the conductive layers 103 may have a thickness between about 500 nm and 1200 nm. In some embodiments, the thickness of the conductive layers 103 may be between about 850 nm and about 1050 nm. In some embodiments, the conductive layers 103 may be conductive lines of back end of line of the semiconductor device 1A. The conductive layers 103 may be electrically coupled to the device elements in the substrate 101.

With reference to FIG. 1, the carbon hard mask layer 105 may be disposed on the conductive layers 103. In some embodiments, the carbon hard mask layer 105 may have a thickness between about 80 nm and about 500 nm. In some embodiments, the thickness of the carbon hard mask layer 105 may be between about 100 nm and about 200 nm.

In some embodiments, the carbon hard mask layer 105 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

Alternatively, in some embodiments, the carbon hard mask layer 105 may be composed of carbon and hydrogen. In some embodiments, the carbon hard mask layer 105 may be composed of carbon, hydrogen, and oxygen. In some embodiments, the carbon hard mask layer 105 may be composed of carbon, hydrogen, and fluorine. Alternatively, in some embodiments, the carbon hard mask layer 105 may be formed of a material identified in the trade as APF (product model, manufactured by AMAT Corp.), a material identified in the trade as SiLK (product model, manufactured by Dow Chemical Co.), a material identified in the trade as NCP (product model, manufactured by ASM Corp.), a material identified in the trade as AHM (product model, manufactured by Novellous Corp.), or similar such materials.

With reference to FIG. 1, the insulating layer 107 may include a lower portion 107-1 and an upper portion 107-3. The lower portion 107-1 may be disposed along the carbon hard mask layer 105, and between adjacent conductive layers 103, and on the substrate 101. The upper portion 107-3 may be disposed on the lower portion 107-1 and on the carbon hard mask layer 105.

In some embodiments, the insulating layer 107 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the undoped silicate glass can be expressed as formula $SiO_x$. The x may be between 1.4 and 2.1.

In some embodiments, the insulating layer 107 may be porous and may be formed from an energy-removable material. Specifically, the porous insulating layer 107 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The porous insulating layer 107 may have a porosity between 25% and 50%. A dielectric constant of the porous insulating layer 107 may be significantly lower than a layer formed of, for example, silicon oxide. Therefore, the porous insulating layer 107 may significantly reduce the parasitic capacitance of conductive elements disposed therein. That is, the porous insulating layer 107 may significantly alleviate an interference effect between electrical signals induced or applied to the semiconductor device 1A.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

With reference to FIG. 1, the conductive via 109 may be disposed along the upper portion 107-3 of the insulating layer 107, along the carbon hard mask layer 105, and on the conductive layers 103. The conductive via 109 may be electrically connected to the conductive layers 103. The conductive via 109 may be formed of, for example, polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

Figure 2:
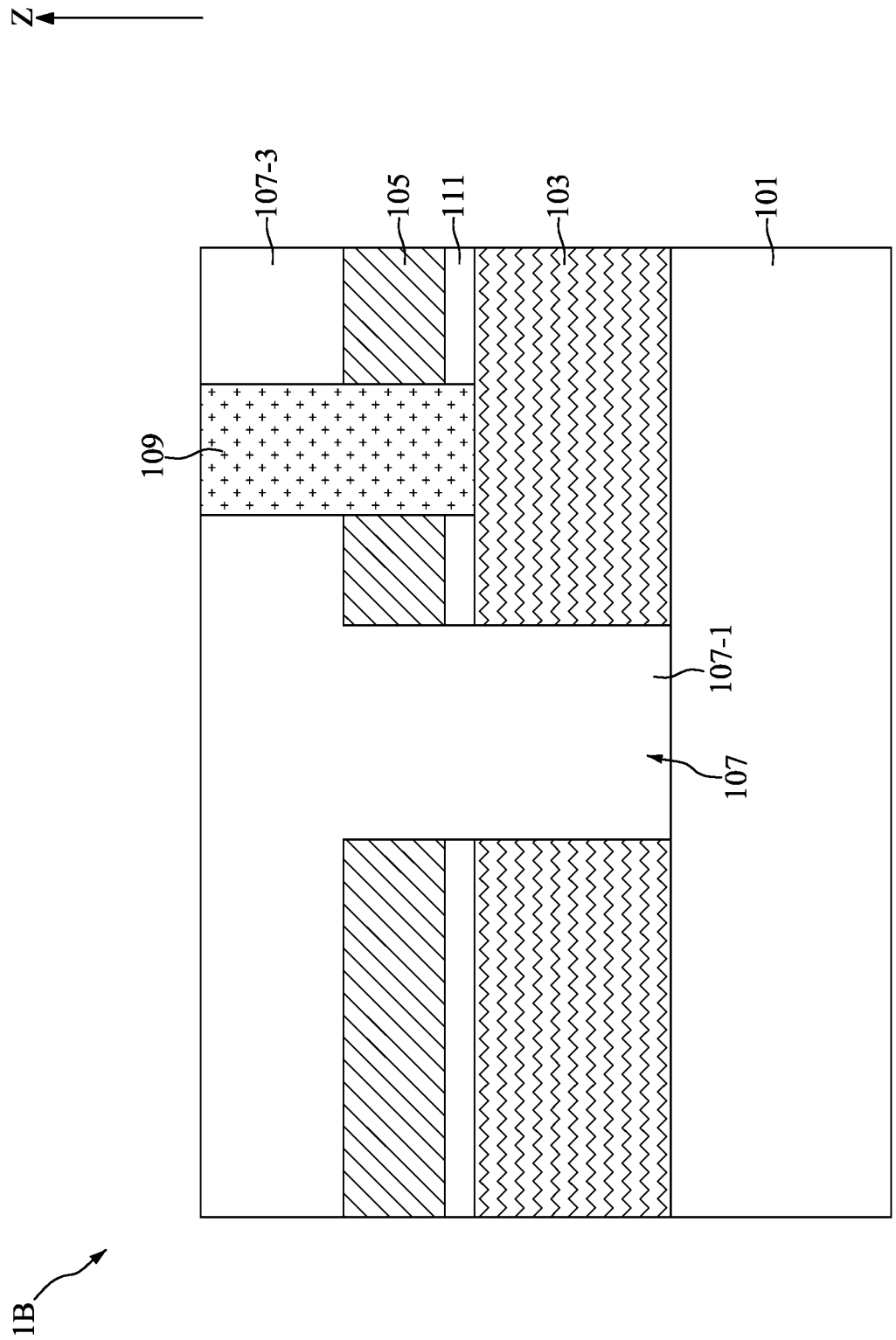
FIG. 2 illustrates, in a schematic cross-sectional view diagram, a semiconductor device in accordance with another embodiment of the present disclosure.

FIG. 2 illustrates, in a schematic cross-sectional view diagram, a semiconductor device 1B in accordance with another embodiment of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the semiconductor device 1B may include adhesion layers 111 disposed between the conductive layers 103 and the carbon hard mask layer 105. In some embodiments, the adhesion layers 111 may have a thickness between about 2 nm and about 100 nm. In some embodiments, the thickness of the adhesion layers 111 may be between about 5 nm and about 30 nm.

In some embodiments, the adhesion layers 111 may be nitrogen-doped carbon layers. The nitrogen-doped carbon layers may have a nitrogen doping concentration of from 1% to 10% by weight, based on the total composition of the adhesion layers 111. Specifically, the nitrogen-doped carbon layers may have a nitrogen doping concentration approximately 5% by weight. In some embodiments, the adhesion layers 111 may be formed of a material selected from the group consisting of silicon oxides, silicon oxynitride, silicon nitride.

In some embodiments, the adhesion layers 111 may be formed by a deposition process using precursors such as $C_2H_4$ or $C_3H_6$ with in-situ nitrogen doping. The doping concentration may be between about 1% and 10%, or specifically, about 5%. The adhesion layers 111 may improve the adhesion between the carbon hard mask layer 105 and adjacent layers. As a result, the defect such as carbon hard mask layer detachments may be reduced or avoided. In addition, the adhesion layers 111 formed by aforementioned deposition may be readily integrated into conventional process flow without using additional equipment.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 3:
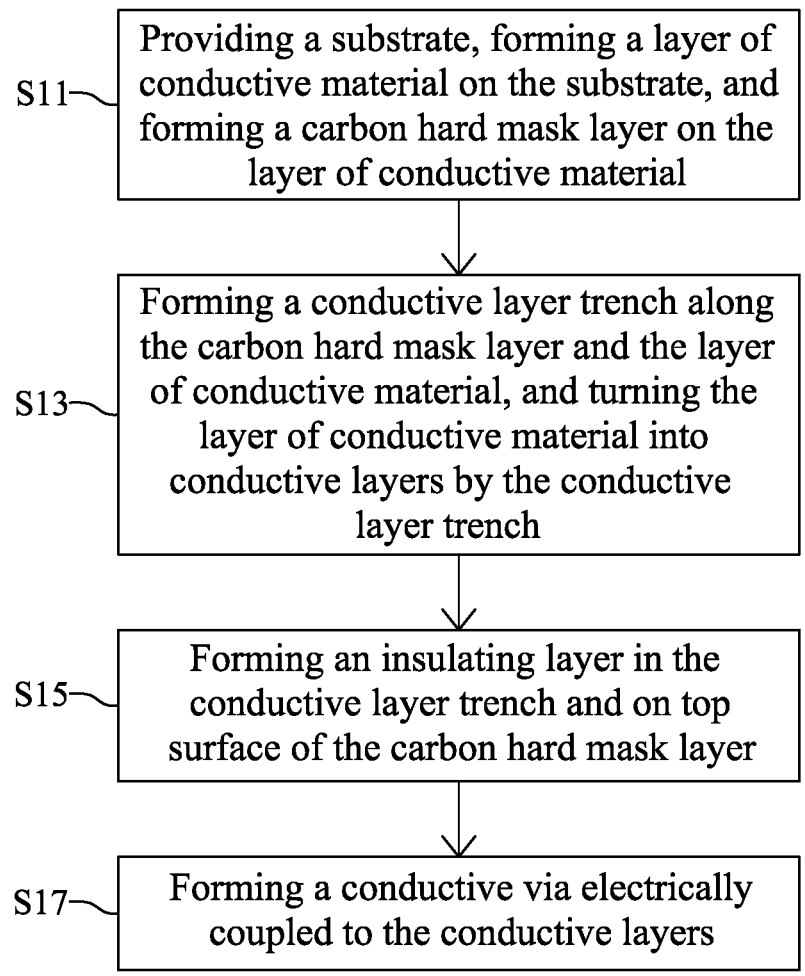
FIG. 3 illustrates, in a flowchart diagram form, a method 10 for fabricating a semiconductor device in accordance with one embodiment of the present disclosure.

FIG. 3 illustrates, in a flowchart diagram form, a method 10 for fabricating a semiconductor device 1A in accordance with one embodiment of the present disclosure. FIGS. 4 to 12 illustrate, in schematic cross-sectional view diagrams, a flow for fabricating the semiconductor device 1A in accordance with one embodiment of the present disclosure.

Figure 4:
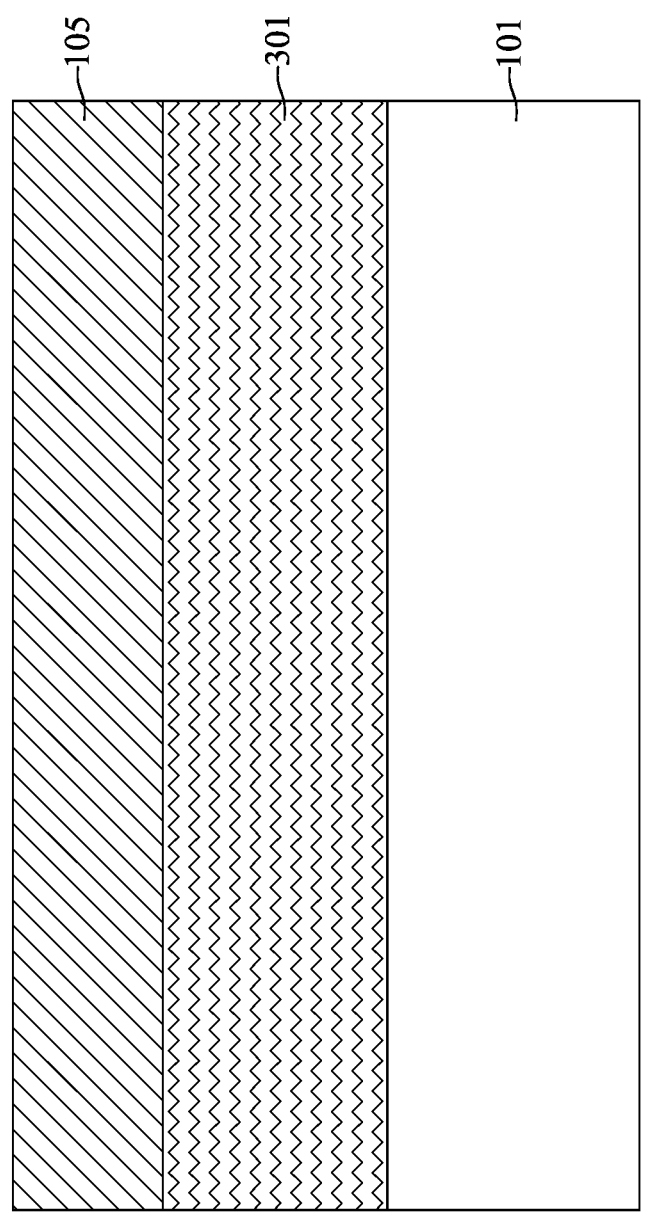
FIGS. 4 to 12 illustrate, in schematic cross-sectional view diagrams, a flow for fabricating the semiconductor device in accordance with one embodiment of the present disclosure.

With reference to FIGS. 3 and 4, at step S11, a substrate 101 may be provided, a layer of conductive material 301 may be formed on the substrate 101, and a carbon hard mask layer 105 may be formed on the layer of conductive material 301.

With reference to FIG. 4, the layer of conductive material 301 may be formed on the substrate 101 by a deposition process such as chemical vapor deposition, physical vapor deposition, sputtering, or the like. The conductive material 301 may be, for example, tungsten, aluminum, titanium, copper, titanium nitride, or a combination thereof.

With reference to FIG. 4, the carbon hard mask layer 105 may be formed on the layer of conductive material 301. In some embodiments, the carbon hard mask layer 105 may be formed by a high density plasma chemical vapor deposition process. The high density plasma may be generated using inductively coupled radio frequency (RF) power in a range between about 500 watts and about 4000 watts. In some embodiments, the high density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm. The process pressure of the high density plasma chemical vapor deposition process may be about 5 millitorr and about 20 millitorr. The process temperature of the high density plasma chemical vapor deposition process may be between about 240° C. and about 340° C.

In some embodiments, the carbon hard mask layer 105 may be formed with fluorine doping by adding a source of fluorine during the high density plasma chemical vapor deposition process. The source of fluorine may be, for example, octafluorocyclobutane, tetrafluoromethane, hexafluoroethane, octafluoropropane, trifluoromethane, hexafluorobenzene, or a combination thereof. The flow rate of the source of fluorine may be between slightly greater 0 and about 150 sccm. The flow rate ratio of the source of fluorine to the source of carbon is important for the doping level and the thermal stability of the carbon hard mask layer 105. For an unbiased process situation, the flow rate ratio of the source of fluorine to the source of carbon may be between about 0.2 and about 2. For a biased process situation, the flow rate ratio of the source of fluorine to the source of carbon may be between about 0.7 and about 1.3.

In some embodiments, an annealing process may be performed after the high density plasma chemical vapor deposition process to enhance the thermal stability of the carbon hard mask layer 105. The annealing process may be carried out in vacuum, or in an inert atmosphere composed of gasses such as argon or nitrogen, at a temperature between about 300° C. and about 450° C. for approximately 30 minutes.

The thickness and uniformity of the carbon hard mask layer 105 formed by the high density plasma chemical vapor deposition process may be well controlled. For example, the standard deviation of the thickness of the carbon hard mask layer 105 may be less than 4%. In addition, the carbon hard mask layer 105 formed by the high density plasma chemical vapor deposition process may be thermally stable at elevated temperatures up to approximately 400° C. Thermal stability means that the carbon hard mask layer 105 will not suffer from weight loss, deformation or chemical reactions when exposed to etch environments at temperatures between about 200° C. and about 400° C. The thermal stability of the carbon hard mask layer 105 at elevated temperatures, will allow for its use as a mask for etch operations that are performed at temperatures higher than 200° C. Furthermore, the etch resistance property of the carbon hard mask layer 105 may be tuned by adjusting the doping level of fluorine. The etch resistive property of the carbon hard mask layer 105 may be decreased with higher doping level of fluorine.

Alternatively, in some embodiments, the carbon hard mask layer 105 may be a carbon film. The carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer desire pattern onto the underlying layers.

With reference to FIG. 3 and FIGS. 5 to 8, at step S13, a conductive layer trench 505 may be formed along the carbon hard mask layer 105 and the layer of conductive material 301, and the layer of conductive material 301 may be turned into conductive layers 103 by the conductive layer trench 505.

Figure 5:
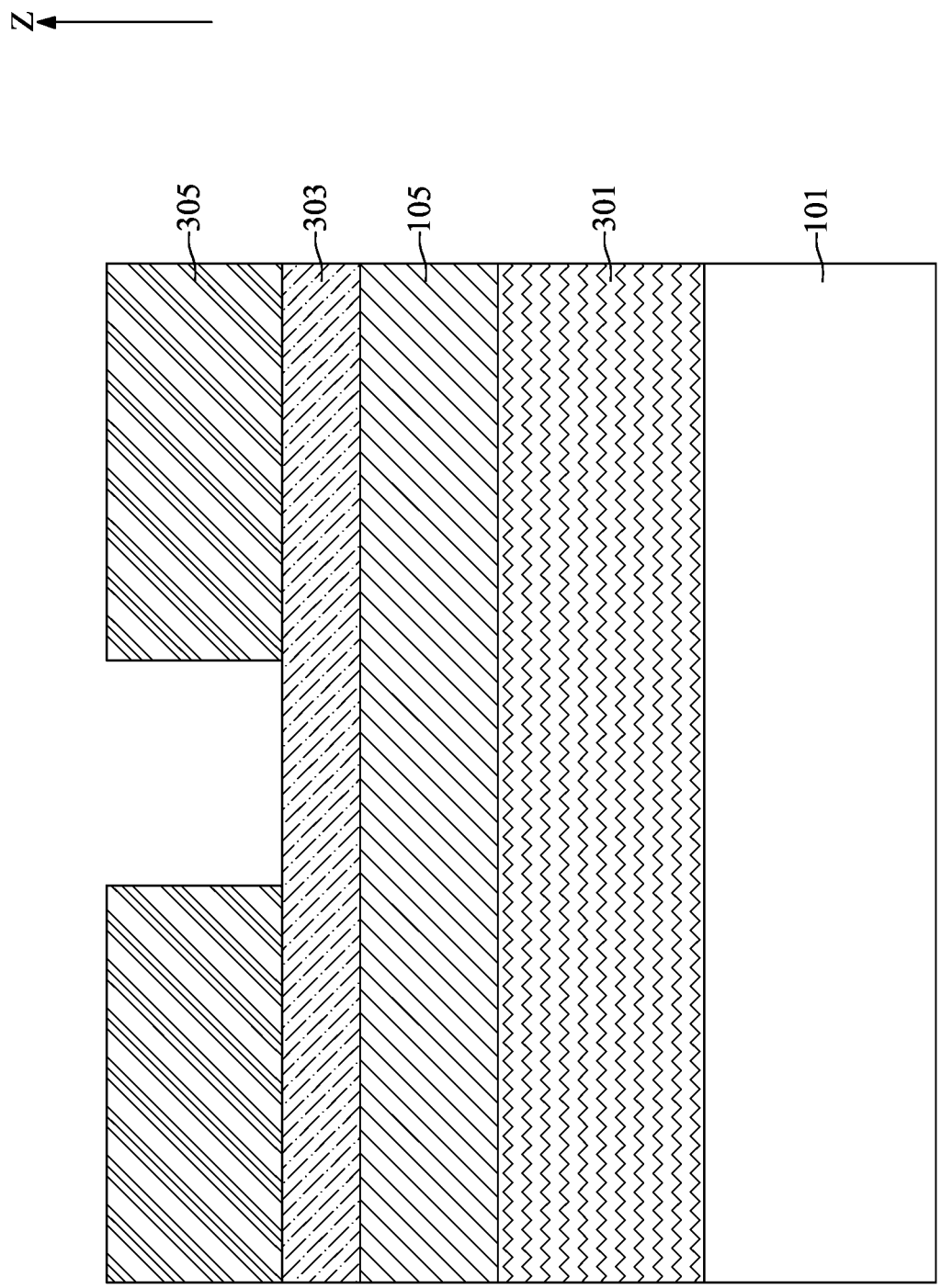

With reference to FIG. 5, a first hard mask layer 303 may be formed on the carbon hard mask layer 105. A first mask layer 305 may be formed on the first hard mask layer 303. The first hard mask layer 303 may have a thickness between about 30 nm and about 50 nm. The first mask layer 305 may be a photoresist layer having a pattern of the conductive layer trench 505.

In some embodiments, the first hard mask layer 303 may be formed of, for example, silicon, silicon germanium, tetraethyl orthosilicate, silicon nitride, silicon oxynitride, silicon nitride oxide, silicon carbide, the like, or a combination thereof. The first hard mask layer 303 may be formed by a deposition process such as chemical vapor deposition, plasma-enhanced chemical vapor deposition, atomic layer deposition, or the like. The process temperature of forming the first hard mask layer 303 may be less than 400° C. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Alternatively, in some embodiments, the first hard mask layer 303 may be formed of, for example, boron nitride, silicon boron nitride, phosphorus boron nitride, boron carbon silicon nitride, or the like. The first hard mask layer 303 may be formed by a film formation process and a treatment process. Specifically, in the film formation process, first precursors, which may be boron-based precursors, may be introduced over the pad oxide to form a boron-based layer. Subsequently, in the treatment process, second precursors, which may be nitrogen-based precursors, may be introduced to react with the boron-based layer and turn the boron-based layer into the first hard mask layer 303.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute); specifically, between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm; specifically, between about 1 slm and about 10 slm.

In some embodiments, the film formation process may be performed without an assistant of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm; specifically, between about 10 sccm and about 1 slm.

In some embodiments, oxygen-based precursors may be together introduced with the second precursors in the treatment process. The oxygen-based precursors may be, for example, oxygen, nitric oxide, nitrous oxide, carbon dioxide, or water.

In some embodiments, silicon-based precursors may be together introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be together introduced with the second precursors in the treatment process. The phosphorus-based precursors may be, for example, phosphine.

In some embodiments, oxygen-based precursors, silicon-based precursors, or phosphorus-based precursors may be together introduced with the second precursors in the treatment process.

In some embodiments, the treatment process may be performed with an assistant of a plasma process, an UV cure process, a thermal anneal process, or a combination thereof.

When the treatment is performed with the assistant of the plasma process. Plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such situation, a substrate temperature of the treatment process may be between about 20° C. and about 1000° C. A process pressure of the treatment process may be between about 10 mTorr and about 760 Torr.

When the treatment is performed with the assistant of UV cure process, in such situation, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the first hard mask layer 303. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the first hard mask layer 303.

When the treatment is performed with the assistant of the thermal anneal process. In such situation, a substrate temperature of the treatment process may be between about 20° C. and about 1000° C. A process pressure of the treatment process may be between about 10 mTorr and about 760 Torr.

Figure 6:
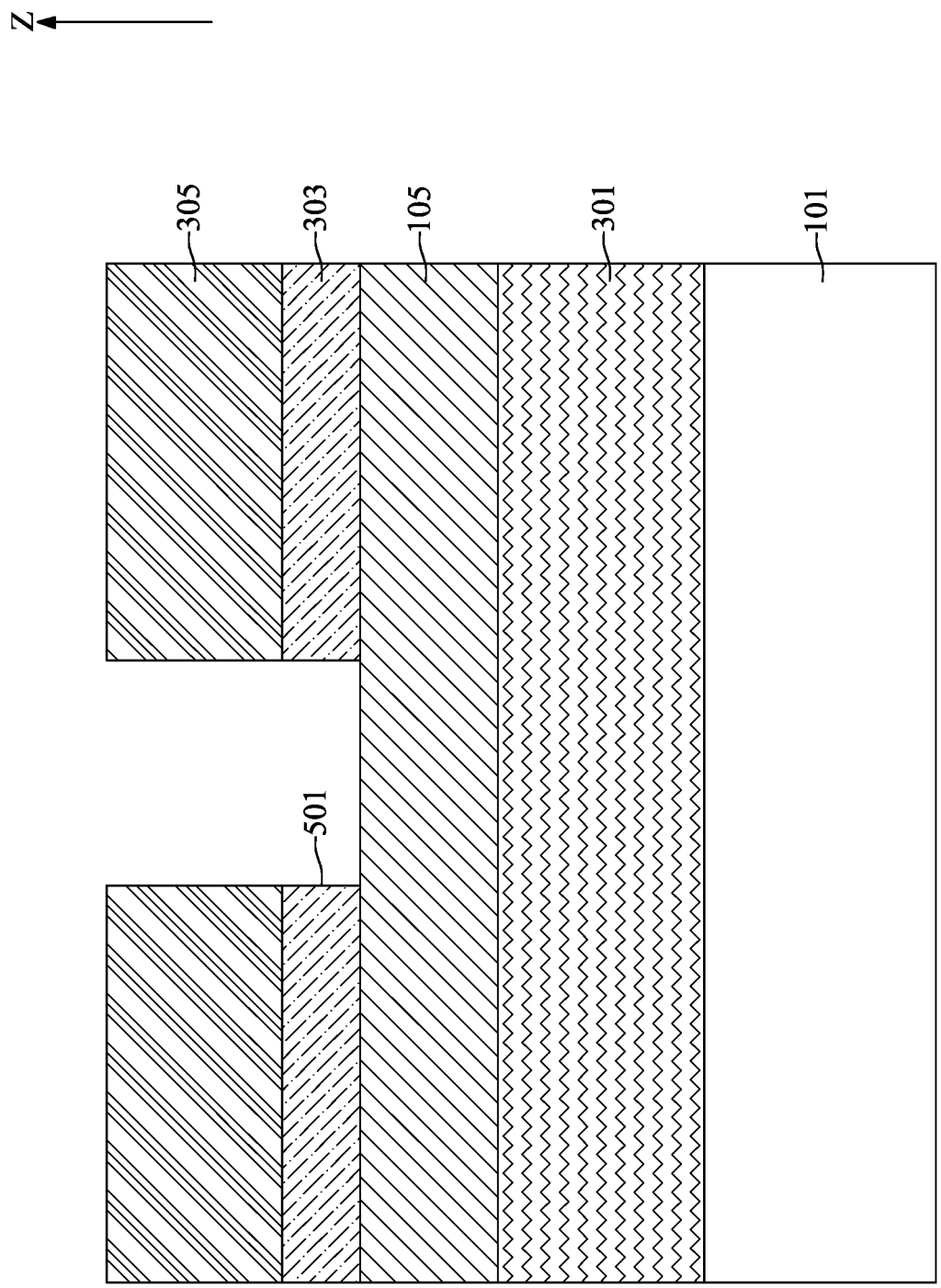

With reference to FIG. 6, a hard mask etch process may be performed to form a first trench 501 along the first hard mask layer 303. The pattern of the conductive layer trench 505 in the first mask layer 305 may be transferred to the first hard mask layer 303 through the first trench 501. A portion of the carbon hard mask layer 105 may be exposed through the first trench 501. In some embodiments, the hard mask etch process may conduct by fluorine-containing plasma using trifluoromethane as plasma source. After the formation of the first trench 501, the first mask layer 305 may be removed.

During the hard mask etch process, the etch rate of the first hard mask layer 303 may be greater than the etch rate of the carbon hardmask layer 105. For example, the etch rate ratio of the first hard mask layer 303 to the carbon hard mask layer 105 may be between about 20:1 and about 2:1. For another example, the etch rate ratio of the first hard mask layer 303 to the carbon hard mask layer 105 may be between about 10:1 and about 3:1. For yet another example, the etch rate ratio of the first hard mask layer 303 to the carbon hard mask layer 105 may be between about 5:1 and about 3:1.

Figure 7:
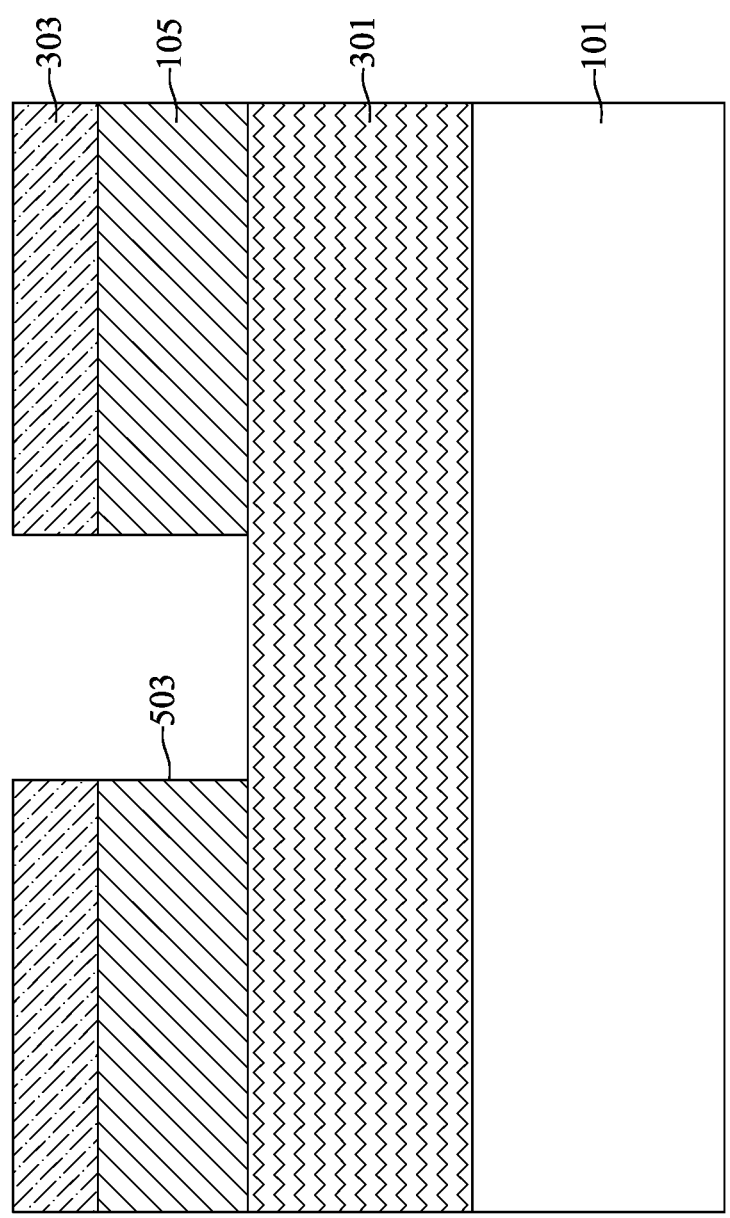

With reference to FIG. 7, a carbon hard mask etch process may be performed to form a second trench 503 along the first hard mask layer 303 and the carbon hard mask layer 105. The second trench 503 may be extended from the first trench 501. The pattern of the conductive layer trench 505 may be transferred to the carbon hard mask layer 105 through the second trench 503. A portion of the layer of conductive material 301 may be exposed through the second trench 503. In some embodiments, the etching gases of the carbon hard mask etch process may be, for example, oxygen-containing gases such as a mixture of an oxygen gas and a nitrogen gas.

In some embodiments, the carbon hard mask etch process may be an anisotropic plasma etching process. The anisotropic plasma etching process may be performed by plasma etching equipment utilizing an inductively coupled plasma technique or using a dual frequency capacitively coupled plasma technique, or any other suitable plasma technique. In some embodiments, the etchant gases of the anisotropic plasma etching process may be a mixture of an oxygen gas and a silicon-containing gas. The silicon-containing gas may be silicon tetrafluoride, silicon tetrachloride, silane, $SiCl_xF_y$, (wherein x+y=4), or a combination thereof. The etchant gases of the anisotropic plasma etching process may include about 50% to 95% by volume of the oxygen gas and correspondingly about 50% to 5% by volume of the silicon-containing gas respectively based on the total volume of the etchant gases at a given process temperature and process pressure.

By using the mixture of the oxygen gas and the silicon-containing gas when etching the carbon hard mask layer 105 using the first hard mask layer 303 as an etch mask as described above, it is possible to adjust the etch selectivity of the first hard mask layer 303 relative to the carbon hard mask layer 105, and thereby to effectively reduce the dimension at the bottom of the second trench 503 relative to the dimension at the upper portion of the second trench 503. In other words, the sidewalls of the second trench 503 in the carbon hard mask layer 105 may be tapered which may be beneficial for subsequent filling process.

Specifically, when the mixture of the oxygen gas and the silicon-containing gas is used as a plasma to etch the carbon hard mask layer 105, a silicon-containing material dissociates from the silicon-containing gas, for example, radicals and ions such as $Si_xF_y$, dissociate, for example from silicon tetrafluoride, and is deposited on the top surfaces of the first hard mask layer 303 to form a polymer residue layer consisting of silicon, fluoride, and oxygen constituents such that the top surfaces of the first hard mask layer 303 is subjected to be passivated and the etch selectivity of the first hard mask layer 303 relative to the carbon hardmask layer 105 is adjusted.

In addition, when etching the carbon hard mask layer 105 to form the second trench 503 therein, the radicals and ions of the silicon-containing gas such as $Si_xF_y$ also form the polymer residue layer consisting of silicon, fluoride, and oxygen constituents on the exposed sidewalls of the carbon hard mask layer 105, thus also forming a passivation layer on these sidewalls. The passivation layer serves as an etch mask until the etching process for forming the second trench 503 ends, such that the dimension at the bottom of the second trench 503 is smaller than the dimension at the upper portion of the second trench 503.

In summary, the polymer residue layer formed on the top surfaces of the first hard mask layer 303 and the exposed sidewalls of the carbon hardmask layer 105 serve as etching masks in the anisotropic plasma etching process. Therefore, the ions which go straight into the second trench 503 cannot reach a portion of the carbon hard mask layer 105 that is covered by the polymer residue layer and thereunder. Therefore, the dimension at the bottom of the second trench 503 is smaller than the dimension at the upper portion of the second trench 503.

Alternatively, in some embodiments, the etching gases of the anisotropic plasma etching process may include the oxygen gas, the silicon-containing gas, and at least one gas selected from a nitrogen gas and an inert gas. Specifically, the etchant gases of the anisotropic plasma etching process may include about 20% to 95% by volume of the oxygen gas based on the total volume of the etchant gases, about 50% to 5% by volume of the silicon-containing gas based on the total volume of the etchant gases, about % to 100% by volume of the nitrogen gas relative to the volume of the oxygen gas in the etchant gases, and about 0% to 50% by volume of the inert gas relative to the volume of oxygen gas in the etchant gases. It should be noted that the content of the nitrogen gas and the content of the inert gas in the etchant gases are not both zero. The presence of the nitrogen gas in the etchant gases provides a lower etch rate than would undiluted oxygen gas with respect to the carbon hard mask layer 105, but the nitrogen gas serves to increase passivation of the exposed sidewalls of the carbon hard mask layer 105 in the second trench 503 during the etching of the carbon hard mask layer 105. This improves anisotropic etching properties and reduces the bottom dimension of the second trench 503. The presence of inert gas in the etching gases improves anisotropic dry etching properties of the etching gases and also stabilizes the plasma atmosphere. The inert gas may be selected from the group consisting of argon, helium, neon and krypton.

For example, the etchant gases of the anisotropic plasma etching process may be a mixture of the oxygen gas, silicon tetrafluoride, the nitrogen gas, and an argon gas. The flow rate of the oxygen gas may be between about 20 sccm and about 60 sccm, for example, 40 sccm. The flow rate of the silicon tetrafluoride may be between about 10 sccm and about 30 sccm, for example, 20 sccm. The flow rate of the nitrogen gas may be between about 10 sccm and about 30 sccm, for example, 20 sccm. The flow rate of the argon gas may be between about 10 sccm and about 30 sccm, for example, 20 sccm. The etchant gas of the anisotropic plasma etching process may include a volume concentration of 40% oxygen gas, 20% silicon tetrafluoride, 20% nitrogen gas, and 20% argon gas. The process duration may be between 70 second and about 110 second, for example, 90 second.

Alternatively, in some embodiments, the etchant gases of the anisotropic plasma etching process may further include a carbon-fluorine-series gas, such as carbon tetrafluoride, hexafluoroethane, perflutren, octafluorocyclobutane, hexafluorocyclobutene, octafluorocyclopentene, or the like. The carbon-fluorine-series gas may be added to the etchant gases to increase an etch rate of the carbon hard mask layer 105. The etchant gases may include, for example, about 0% to 10% by volume of the carbon-fluorine-series gas based on the total volume of the etchant gases.

The first hard mask layer 303 may be removed after the formation of the second trench 503.

Figure 8:
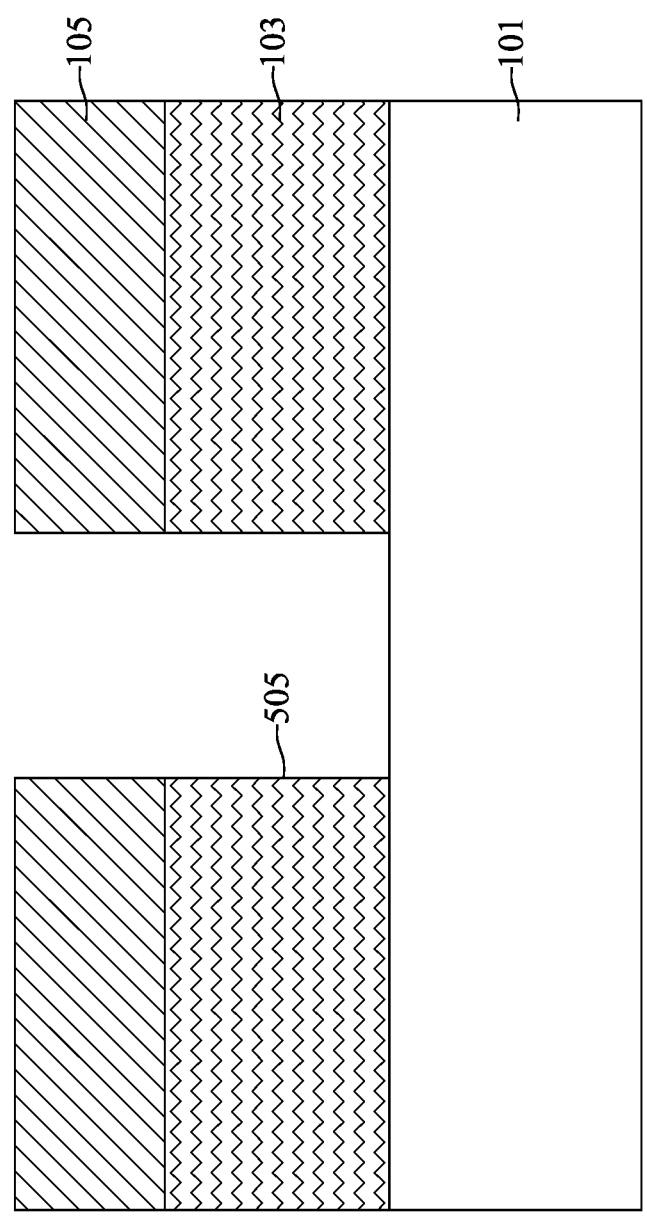

With reference to FIG. 8, a conductive layer etch process may be performed to form the conductive layer trench 505 along the second trench 503 and the layer of conductive material 301. The conductive layer trench 505 may be extended from the second trench 503. The pattern of the conductive layer trench 505 may be transferred from the carbon hard mask layer 105 to the layer of conductive material 301 and turn the layer of conductive material 301 into conductive layers 103. A portion of the substrate 101 may be exposed through the conductive layer trench 505. In some embodiments, the process temperature of the conductive layer etch process may be between about 200° C. and about 550° C. In some embodiments, the process temperature of the conductive layer etch process may be between about 300° C. and about 450° C. In some embodiments, the etchant gases of the conductive layer etch process may be a mixture of chlorine gas and boron trichloride gas.

During the conductive layer etch process, the etch rate of the conductive layers 103 may be greater than the etch rate of the carbon hard mask layer 105 and the etch rate of the substrate 101. For example, the etch rate ratio of the conductive layers 103 to the carbon hard mask layer 105 may be between about 20:1 and about 3:1. For another example, the etch rate ratio of the conductive layers 103 to the carbon hardmask layer 105 may be between about 10:1 and about 3:1. For yet another example, the etch rate ratio of the conductive layers 103 to the carbon hard mask layer 105 may be between about 5:1 and about 3:1.

For example, the etch rate ratio of the conductive layers 103 to the substrate 101 may be between about 20:1 and about 3:1. For another example, the etch rate ratio of the conductive layers 103 to the substrate 101 may be between about 10:1 and about 3:1. For yet another example, the etch rate ratio of the conductive layers 103 to the substrate 101 may be between about 5:1 and about 3:1.

Figure 9:
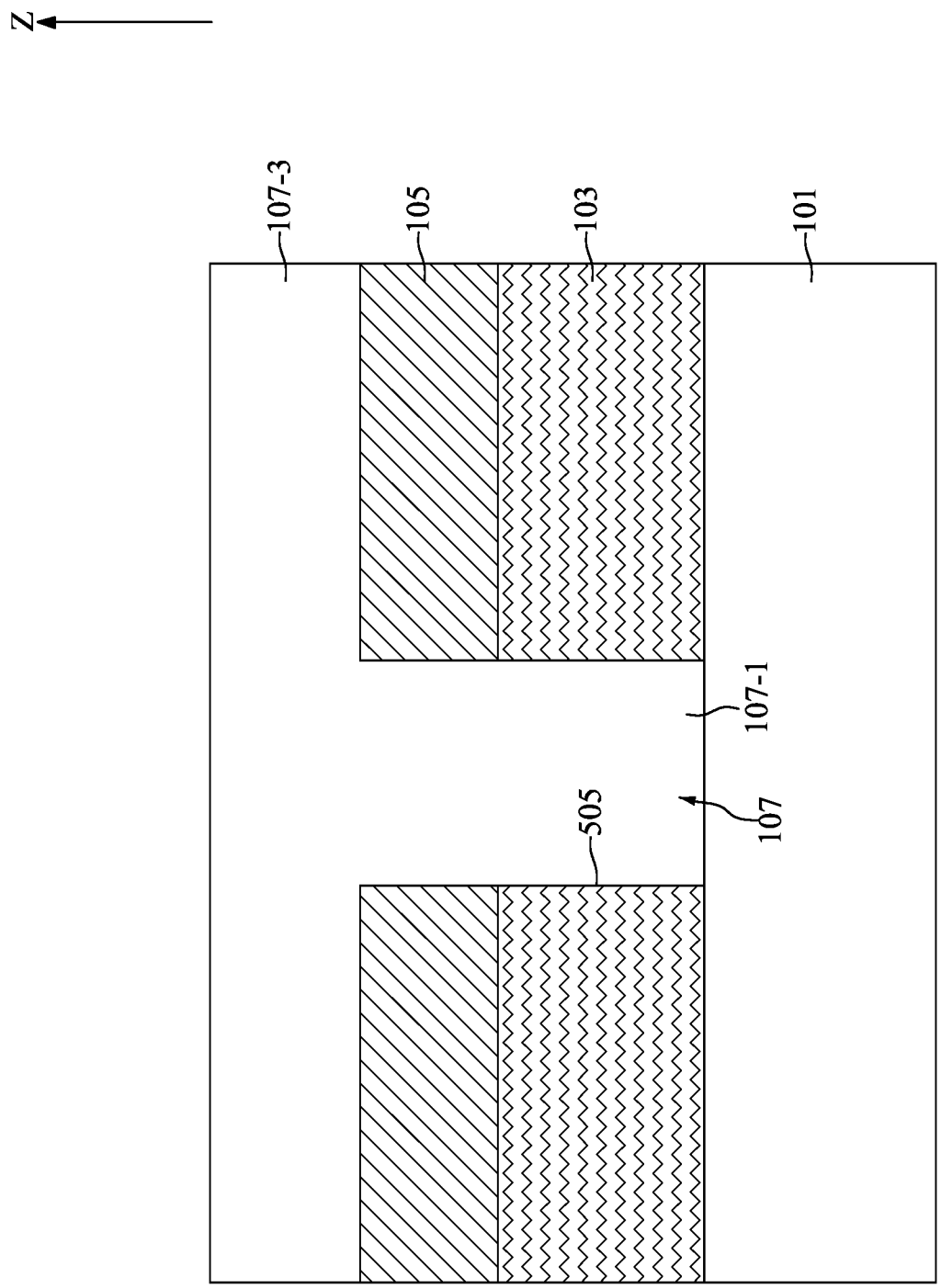

With reference to FIGS. 3 and 9, at step S15, an insulating layer 107 may be formed in the conductive layer trench 505 and on the top surfaces of the carbon hard mask layer 105.

With reference to FIG. 9, the insulating layer 107 may be formed by a deposition such as chemical vapor deposition or plasma-enhanced chemical vapor deposition. The insulating layer 107 may include a lower portion 107-1 and an upper portion 107-3. The lower portion 107-1 may be formed to completely fill the conductive layer trench 505. The upper portion 107-3 may be formed on the lower portion 107-1 and on the top surfaces of the carbon hard mask layer 105. A planarization process, such as chemical mechanical polishing, may be performed to the upper portion 107-3 to provide a substantially flat surface for subsequent processing steps. It should be noted that the carbon hardmask layer 105 is not removed in the present disclosure to reduce the complexity for fabricating of the semiconductor device 1A. The carbon hard mask layer 105 and the insulating layer 107 may together provide electrically insulation function for the conductive layers 103.

In some embodiments, the insulating layer 107 may be formed of energy-removable material. The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. An energy treatment may be applied to remove decomposable porogen material and provide porosity to the insulating layer 107. The energy source may include heat, light, or a combination thereof. When heat is used as the energy source, a temperature of the energy treatment may be between about 800° C. and about 900° C. When light is used as the energy source, an ultraviolet light may be applied.

With reference to FIG. 3 and FIGS. 10 to 12, at step S17, a conductive via 109 may be formed electrically coupled to the conductive layers 103.

Figure 10:
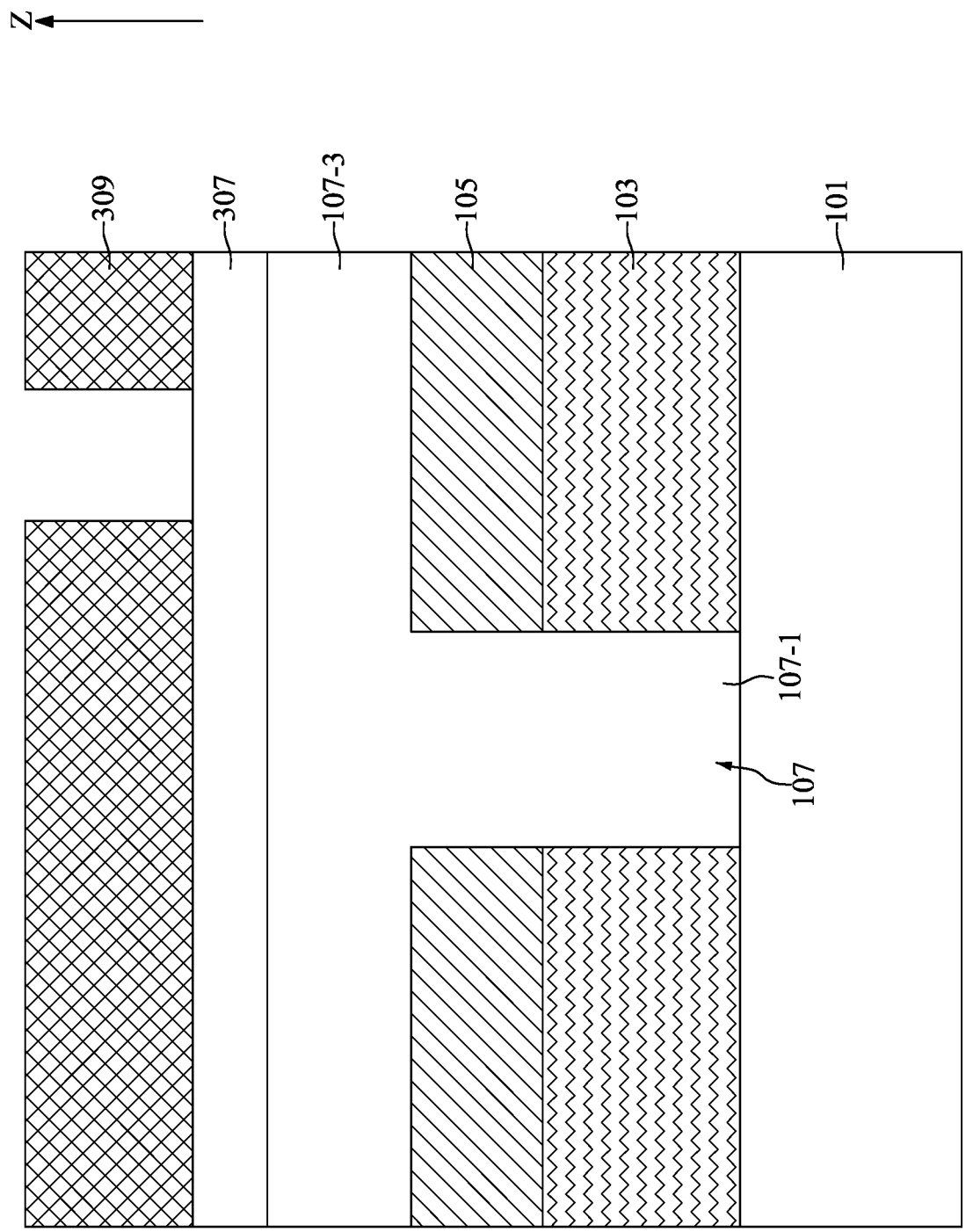

With reference to FIG. 10, a second hard mask layer 307 may be formed on the upper portion 107-3 of the insulating layer 107. The second hard mask layer 307 may have a thickness between about 30 nm and about 50 nm. In some embodiments, the second hard mask layer 307 may be formed of the same material as the first hard mask layer 303. In some embodiments, the second hard mask layer 307 may be formed of, for example, silicon, silicon germanium, tetraethyl orthosilicate, silicon nitride, silicon oxynitride, silicon nitride oxide, silicon carbide, boron nitride, silicon boron nitride, phosphorus boron nitride, boron carbon silicon nitride, or a carbon film. The second hard mask layer 307 may be formed by a similar procedure to the first hard mask layer 303 illustrated in FIG. 5.

With reference to FIG. 10, a second mask layer 309 may be formed on the second hard mask layer 307. The second mask layer 309 may be a photoresist layer having a pattern of the conductive via 109.

Figure 11:
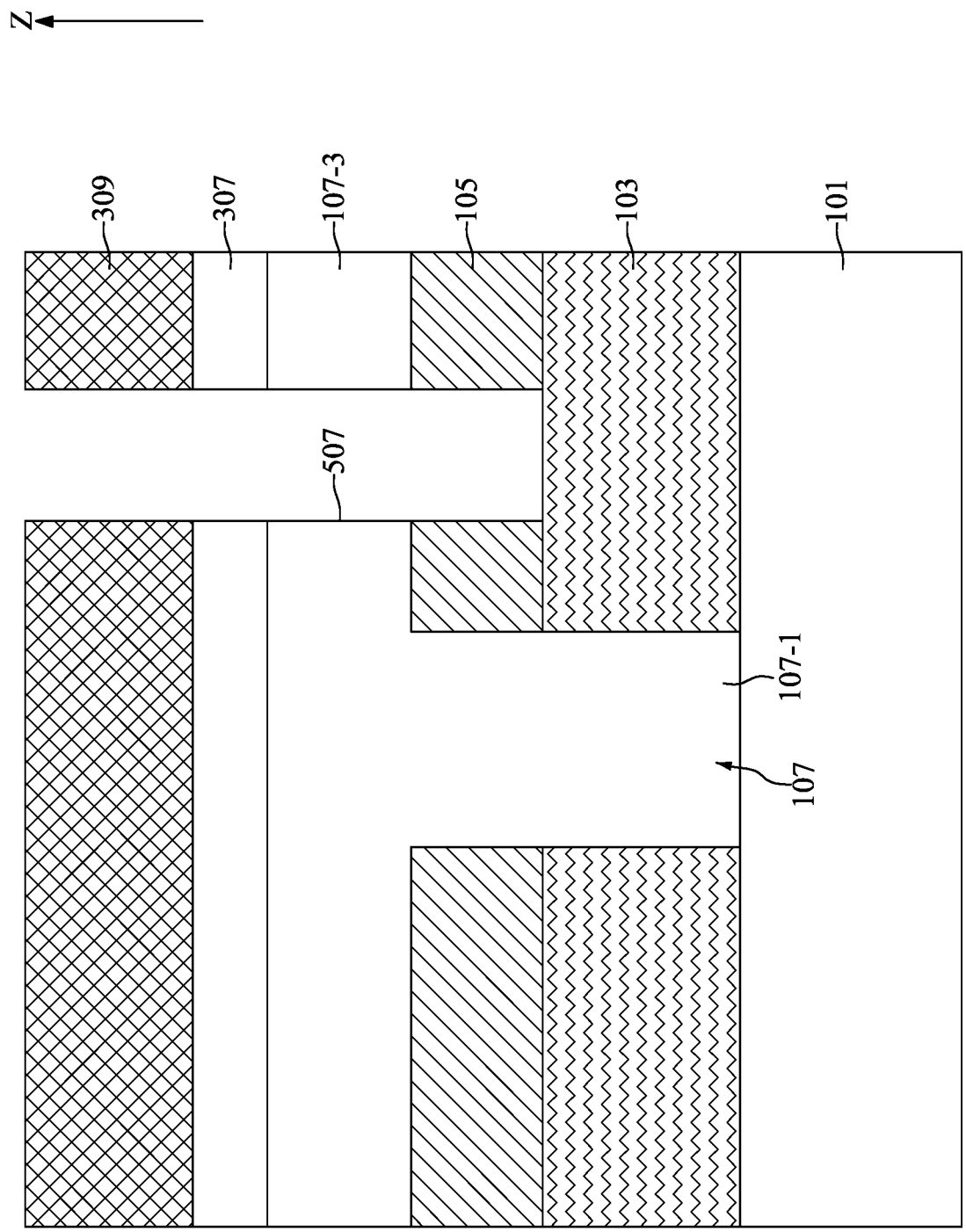

With reference to FIG. 11, a via etch process may be performed to form a first opening 507 along the second hard mask layer 307, the upper portion 107-3 of the insulating layer 107, and the carbon hardmask layer 105. The pattern of the conductive via 109 is inherited by the first opening 507. A portion of the conductive layers 103 may be exposed through the first opening 507.

The via etch process may be conducted in any suitable plasma processing apparatus, for example, a reactive ion etching apparatus. The reactive ion etching apparatus may contain an anode and cathode within a vacuum chamber. The cathode is typically in the form of a pedestal for supporting a semiconductor wafer within the chamber, while the anode is typically formed of the walls and top of the chamber. To process a wafer, a plasma source gas is pumped into the vacuum chamber and the anode and cathode are driven by a single sinusoidal frequency source to excite the plasma source gas into a plasma. The single frequency is typically 13.56 MHz, although frequencies from 100 kHz to 2.45 GHz are often used, with the occasional use of other frequencies. The RF power excites the plasma source gas, producing a plasma within the chamber proximate the semiconductor wafer being processed. The etching chemistry used in the via etch process by the reactive ion etching apparatus is preferably based on a plasma source gas that contains nitrogen atoms and fluorine atoms. As one example, nitrogen trifluoride gas can be used. As another example, a mixture of (a) a gas species containing nitrogen atoms and (b) a gas species containing fluorine atoms can be used. For instance, a plasma source gas containing a mixture of a nitrogen gas and one or more carbon-fluorine-series gases may be used. The carbon-fluorine-series gas may be, for example, carbon tetrafluoride, hexafluoroethane, or octafluorocyclobutane.

In some embodiments, the plasma processing apparatus may also be a magnetically enhanced reactive ion etch apparatus. Such an apparatus is typically provided with one or more magnets or magnetic coils that magnetically control the plasma to facilitate a more uniform via etch process.

Figure 12:
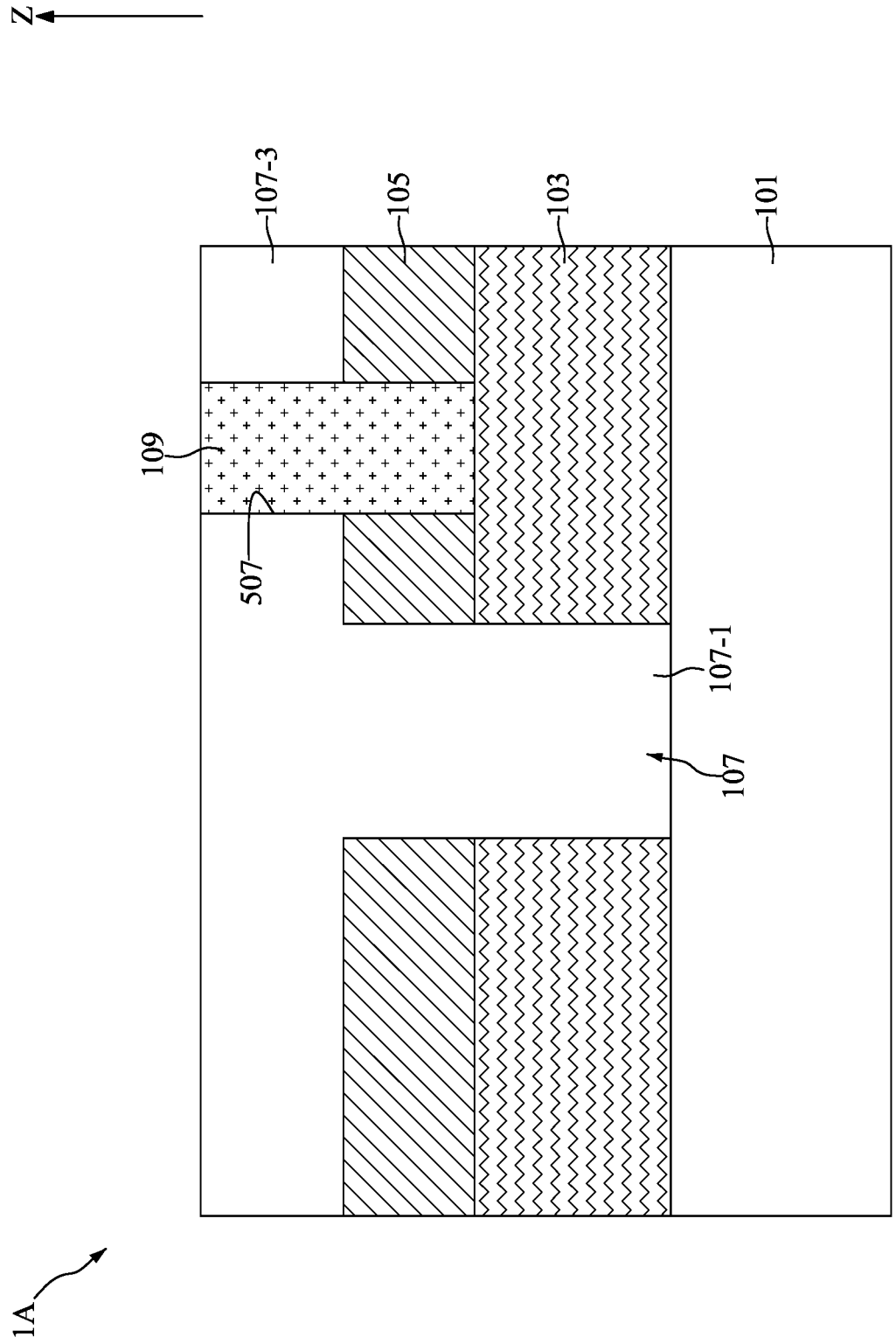

With reference to FIG. 12, the second mask layer 309 and the second hard mask layer 307 may be removed after formation of the first opening 507. Conductive material such as polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof may be deposited into the first opening 507 by a deposition process. After the deposition process, a planarization process, such as chemical mechanical polishing, may be performed to remove excess material, provide a substantially flat surface for subsequent processing steps, and conformally form the conductive via 109 in the first opening 507.

One aspect of the present disclosure provides a semiconductor device including a substrate, conductive layers positioned on the substrate, a carbon hard mask layer positioned on the conductive layers, an insulating layer including a lower portion and an upper portion, and a conductive via positioned along the upper portion of the insulating layer and the carbon hard mask layer and positioned on one of the adjacent pair of the conductive layers. The lower portion is positioned along the carbon hard mask layer and positioned between an adjacent pair of the conductive layers, and the upper portion is positioned on the lower portion and on the carbon hard mask layer.

Another aspect of the present disclosure provides a method for fabricating a semiconductor device including providing a substrate, forming a layer of conductive material on the substrate, forming a carbon hard mask layer on the layer of conductive material, forming a conductive layer trench along the carbon hard mask layer and the layer of conductive material and turning the layer of conductive material into conductive layers, forming an insulating layer to completely fill the conductive layer trench and on the carbon hard mask layer, and forming a conductive via electrically coupled to the conductive layers.

Due to the design of the semiconductor device of the present disclosure, the carbon hard mask layer 105 may acts as a carbon source for passivating the conductive layers 103 using thin polymer films, thereby preventing corrosion of the conductive layers 103. As a result, the yield/reliability of the semiconductor device 1A may be improved. In addition, the excellent etch selectivity of the carbon hard mask layer 105 may be beneficial to form fine etch profile during formation of the conductive layers 103. Furthermore, the carbon hard mask layer 105 can be kept for providing electrically insulation function for the conductive layers 103. Hence, the complexity of fabricating of the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   conductive layers positioned on the substrate, wherein the conductive layers are spaced apart with each other to form a conductive layer trench therebetween;
   a carbon hard mask layer positioned on the conductive layers, wherein the carbon hard mask layer has a trench formed therethrough, wherein the trench is aligned with the conductive layer trench between the conductive layers;
   an insulating layer comprising a lower portion and an upper portion integrally extended from the lower portion, wherein the lower portion is positioned along the carbon hard mask layer through the trench thereof and positioned between an adjacent pair of the conductive layers through the conductive layer trench, and the upper portion is positioned on the carbon hard mask layer; and
   a conductive via positioned along and extended through the upper portion of the insulating layer and the carbon hard mask layer, and extended to directly contact with one of the adjacent pair of the conductive layers in order to electrically couple the conductive via with the conductive layer.

2. The semiconductor device of claim 1, wherein a thickness of the carbon hard mask layer is between about 80 nm and about 500 nm.

3. The semiconductor device of claim 2, wherein the insulating layer is formed of a low-k dielectric material.

4. The semiconductor device of claim 3, wherein the carbon hard mask layer is formed of a carbon film.

5. The semiconductor device of claim 4, further comprising an adhesion layer positioned between the carbon hard mask layer and the conductive layers.

6. The semiconductor device of claim 1, wherein a width of the trench of the carbon hard mask layer equals to a width of the conductive layer trench.

7. The semiconductor device of claim 1, wherein a height of the lower portion of the insulating layer equals to an overall thickness of the conductive layer and the carbon hard mask layer.

8. The semiconductor device of claim 1, wherein the conductive via has a top surface being coplanar with a top surface of the upper portion of the insulating layer and a bottom surface in direct contact with a top surface of the conductive layer.

* * * * *